(12) United States Patent
Sumida et al.

(10) Patent No.: US 9,837,492 B2
(45) Date of Patent: Dec. 5, 2017

(54) SEMICONDUCTOR DEVICE AND METHOD FOR MANUFACTURING THE SAME

(71) Applicant: Renesas Electronics Corporation, Toyko (JP)

(72) Inventors: Wataru Sumida, Ibaraki (JP); Akihiro Shimomura, Ibraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/079,338

(22) Filed: Mar. 24, 2016

(65) Prior Publication Data

US 2016/0336443 A1 Nov. 17, 2016

(30) Foreign Application Priority Data

May 15, 2015 (JP) .................................. 2015-099984

(51) Int. Cl.
*H01L 29/78* (2006.01)
*H01L 29/08* (2006.01)
(Continued)

(52) U.S. Cl.
CPC .... *H01L 29/0847* (2013.01); *H01L 29/42368* (2013.01); *H01L 29/42376* (2013.01);
(Continued)

(58) Field of Classification Search
CPC ............ H01L 29/7813; H01L 29/7827; H01L 29/0603; H01L 29/0657; H01L 29/0661; H01L 29/0696; H01L 29/1033; H01L 29/1037; H01L 29/1095; H01L 29/4236; H01L 29/66734; H01L 29/66666; H01L 29/0847

See application file for complete search history.

(56) References Cited

U.S. PATENT DOCUMENTS 6,060,747 A * 5/2000 Okumura ............ H01L 29/0696
257/331
8,222,109 B2 * 7/2012 Yamamoto ........ H01L 29/42368
257/E21.615

(Continued)

FOREIGN PATENT DOCUMENTS

JP 2010-258252 A 11/2010

*Primary Examiner* — Michael Trinh
(74) *Attorney, Agent, or Firm* — McGinn IP Law Group, PLLC.

(57) ABSTRACT

In a vertical MOSFET in which bottom portions of each gate electrode formed in a ditch are extended toward the drain region, the on resistance is reduced while preventing voltage resistance reduction and switching speed reduction caused by a capacitance increase between the gate and drain. A vertical MOSFET includes first ditches, second ditches, and gate electrodes. The first ditches are formed in an upper surface portion of an epitaxial layer formed over a semiconductor substrate and extend in a second direction extending along a main surface of the semiconductor substrate. The second ditches are formed in bottom surface portions of each of the first ditches and are arranged in the second direction. The gate electrodes are formed in the first ditches and second ditches. The gate electrodes formed in the first ditches include lower electrodes arranged in the second direction.

15 Claims, 12 Drawing Sheets

(51) Int. Cl.
   *H01L 29/423* (2006.01)
   *H01L 29/66* (2006.01)
   *H01L 29/10* (2006.01)
(52) U.S. Cl.
   CPC .. *H01L 29/66727* (2013.01); *H01L 29/66734* (2013.01); *H01L 29/7813* (2013.01); *H01L 29/0878* (2013.01); *H01L 29/1095* (2013.01)

(56) References Cited

U.S. PATENT DOCUMENTS

| | | | | |
|---|---|---|---|---|
| 8,552,468 B2* | 10/2013 | Narazaki | ............ | H01L 29/7397 257/133 |
| 2007/0181939 A1* | 8/2007 | Huang | ................ | H01L 29/0696 257/330 |
| 2013/0341708 A1* | 12/2013 | Sumida | ............... | H01L 29/7827 257/330 |

* cited by examiner

SEMICONDUCTOR DEVICE AND METHOD FOR MANUFACTURING THE SAME

CROSS-REFERENCE TO RELATED APPLICATIONS

The disclosure of Japanese Patent Application No. 2015-099984 filed on May 15, 2015 including the specification, drawings and abstract is incorporated herein by reference in its entirety.

BACKGROUND

The present invention relates to a semiconductor device and a manufacturing method for the same, and can be applied to the manufacture of, for example, a semiconductor device including a trench-type MOSFET.

As an example of a field-effect transistor in which a current is made to flow between the main surface side and reverse side of a semiconductor substrate, a trench-gate type (vertical) MOSFET (metal oxide semiconductor field-effect transistor) is known which includes gate electrodes formed in ditches which are formed in an upper surface portion of a semiconductor layer formed over the main surface of the semiconductor substrate.

In Japanese Unexamined Patent Application Publication No. 2010-258252 (patent document 1), a vertical MOSFET is disclosed which includes a source region formed in an upper surface portion of a semiconductor layer formed over a semiconductor substrate, a drain region formed on the reverse side of the semiconductor substrate, and gate electrodes formed in ditches which are formed in an upper surface portion of the semiconductor layer. In the vertical MOSFET, portions of each gate electrode are extended with a narrow width toward the drain region side.

SUMMARY

When, as described in Japanese Unexamined Patent Application Publication No. 2010-258252, a part of each gate electrode is extended toward the drain region side, the depletion layer from the extended part of each gate electrode can more easily extend when the vertical MOSFET is in an off state. This causes the depletion layers from the extended parts of adjacent gate electrodes to come in contact with each other to, thereby, block the current path. Hence, the voltage resistance of the vertical MOSFET in an off state is increased.

However, when a part of each gate electrode is extended toward the drain region side, the capacitance (feedback capacitance Crss) between the extended part of each gate electrode and the drain region on the reverse side of the semiconductor substrate increases. This decreases the switching speed of the vertical MOSFET.

Other objects and novel features of the present invention will become apparent from the description of this specification and the attached drawings.

Of the embodiments being disclosed in this application, typical ones are briefly described below.

A semiconductor device according to an embodiment of the present invention is a vertical MOSFET including gate electrodes each formed in each of ditches which are formed in an upper surface portion of a semiconductor layer formed over a main surface of a semiconductor substrate. The gate electrodes each extend in a second direction extending along a main surface of the semiconductor substrate and each include portions which extend toward a drain region on the underside of the semiconductor substrate and which are arranged in the second direction.

According to a semiconductor device manufacturing method of an embodiment of the present invention, a vertical MOSFET is manufactured, the vertical MOSFET including gate electrodes each formed in each of ditches which are formed in an upper surface portion of a semiconductor layer formed over a main surface of a semiconductor substrate. The gate electrodes each extend in a second direction extending along a main surface of the semiconductor substrate and each include portions which extend toward a drain region on the underside of the semiconductor substrate and which are arranged in the second direction.

According to an embodiment of the present invention, the performance of a semiconductor device can be improved.

DETAILED DESCRIPTION

Embodiments of the present invention will be described below in detail with reference to drawings. Note that, in all drawings referred to in describing the following embodiments, members having identical functions are denoted by identical symbols and such members will not be repeatedly described. Also, in describing the following embodiments, identical or similar parts will not be repeatedly described except when particularly necessary.

The following embodiments will be described based on an n-channel type vertical MOSFET. The term "mask" referred to in this application means a protective film (etching mask) used to protect particular objects from etching.

Symbols "−" and "+" represent relative impurity concentrations in semiconductors of n and p conductivity types. In the case of n-type impurities, for example, the impurity concentration is higher in the order of "n$^-$", "n" and "n$^+$", "n$^+$" being the highest. There are cases in which these conductivity types "n$^-$", "n" and "n$^+$" are commonly referred to as "n types" regardless of their relative concentrations. This also applies to p-type semiconductors.

First Embodiment

<Semiconductor Device Structure>

Figure 2:
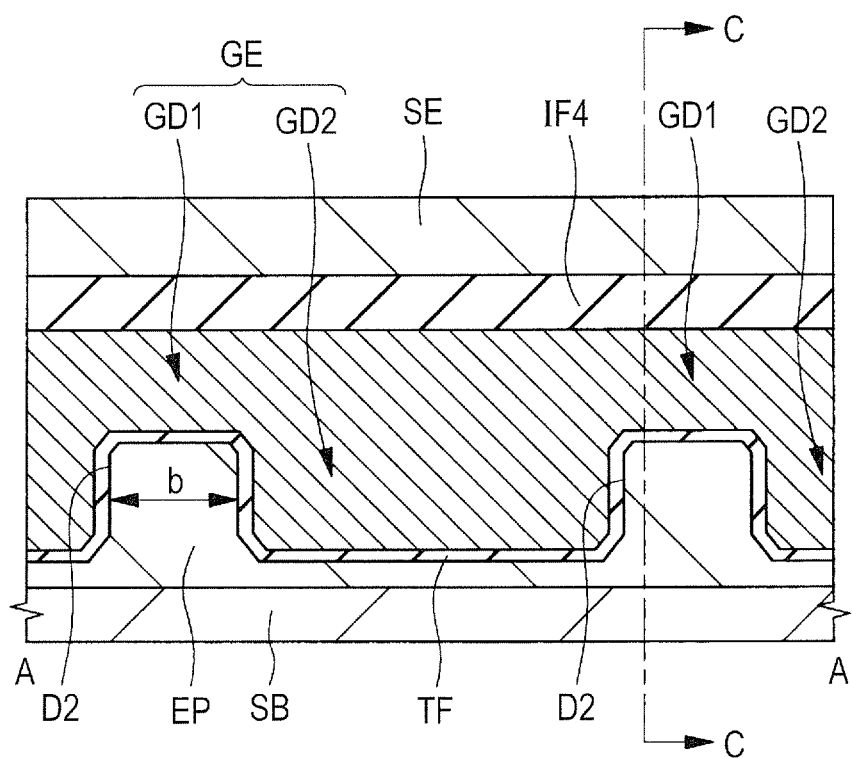
FIG. 2 is a sectional view taken along line A-A in FIG. 1.
Figure 3:
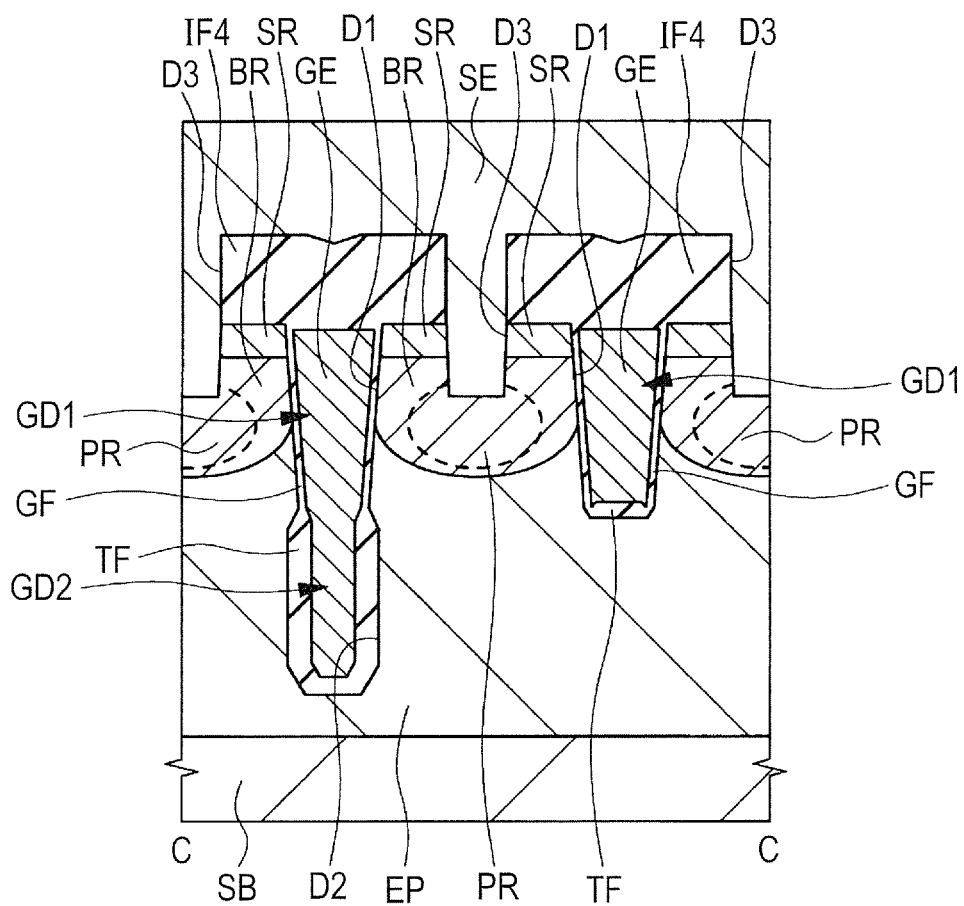
FIG. 3 is a sectional view taken along line C-C in FIG. 2.
Figure 4:
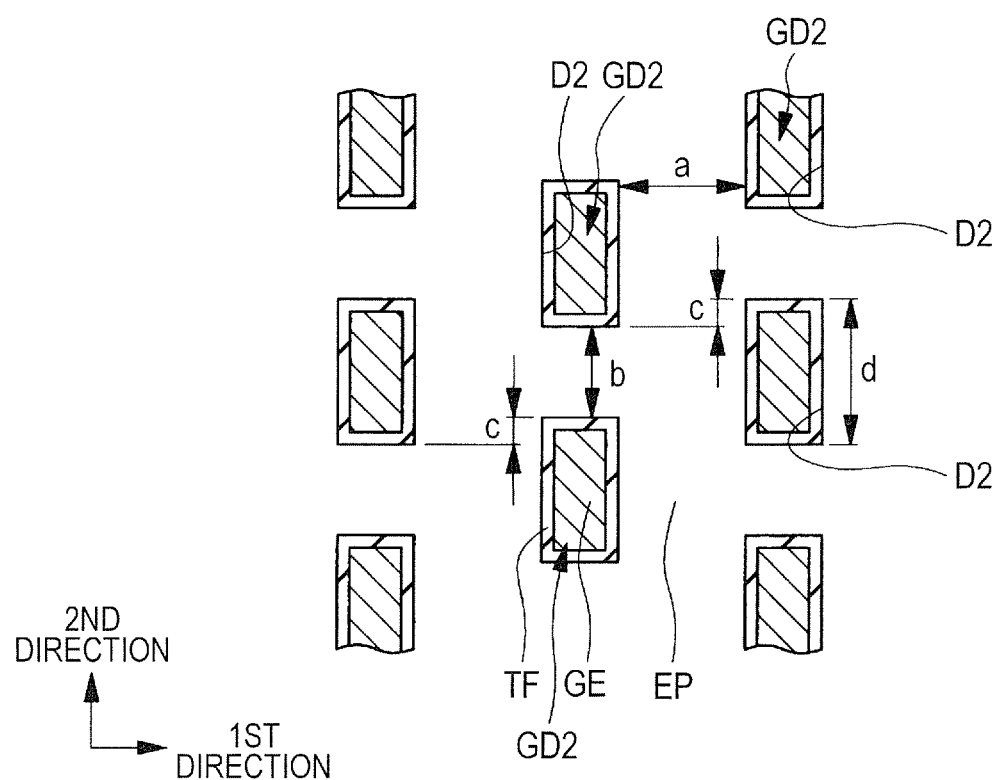
FIG. 4 is a sectional view taken along line B-B in FIG. 1.

A semiconductor device of a first embodiment will be described with reference to FIGS. 1 to 4. FIGS. 1 to 4 are sectional views of the semiconductor device of the present embodiment. FIG. 2 is a sectional view taken along line A-A in FIG. 1. FIG. 3 is a sectional view taken along line C-C in FIG. 2. FIG. 4 is a sectional view taken along line B-B in FIG. 1.

Figure 1:
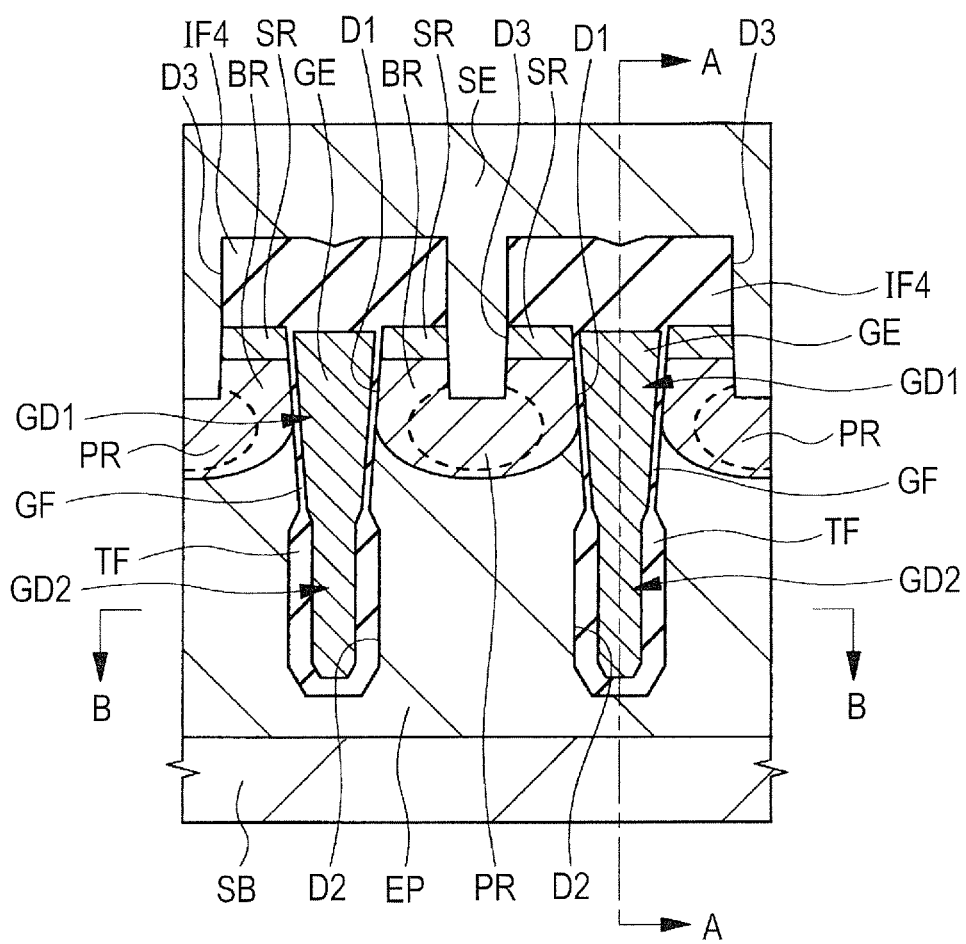
FIG. 1 is a sectional view of a semiconductor device according to a first embodiment of the present invention.

As shown in FIG. 1, the semiconductor device of the present embodiment is a vertical MOSFET (MOS field-effect transistor) and includes a semiconductor substrate SB and an epitaxial layer EP formed over the semiconductor substrate SB. The semiconductor substrate SB is formed of, for example, an n$^+$-type monocrystal silicon (Si). The epitaxial layer EP is an epitaxially grown layer formed over the semiconductor substrate SB by an epitaxial growth method. The epitaxial layer EP is a semiconductor layer formed of an n$^-$-type silicon layer. In portions of the epitaxial layer EP, base regions BR, which are p-type semiconductor regions, are formed as being described later.

Plural ditches D1 are formed in an upper surface portion of the epitaxial layer EP. The ditches D1 have a depth extending into the epitaxial layer EP without reaching the semiconductor substrate SB. At the bottom of each ditch D1, a ditch D2 is formed to be continuous from the ditch D1. Each ditch D2 has a depth extending from the bottom portion of each ditch D1 toward the semiconductor substrate SB without reaching the semiconductor substrate SB. Namely, each ditch D1 and the ditch D2 formed therein make up a ditch formed in an upper surface portion of the epitaxial layer EP without reaching the semiconductor substrate SB.

The ditches D1 are arranged along a first direction which extends along a main surface of the semiconductor substrate SB. The section shown in FIG. 1 extends along the first direction. The side wall of each ditch D1 is covered with a gate insulating film GF formed of, for example, a silicon oxide film. The side wall and bottom surface of each ditch D2 are covered with an insulating film (field oxide film) TF formed of, for example, a silicon oxide film. The insulating film TF is thicker than the gate insulating film GF formed over the side wall of each ditch D1. The film thicknesses referred to in the present application indicate film thicknesses in the direction perpendicular to the respective base surfaces.

In each ditch formed of continuous ditches D1 and D2 whose surfaces are respectively covered with a gate insulating film GF and an insulating film TF, a gate electrode GE formed of, for example, a polysilicon film is buried. In this specification, of each gate electrode GE, the portion formed in a ditch D1 will be referred to as an upper electrode GD1 and the portion formed in a ditch D2 will be referred to as a lower electrode GD2. Namely, in each ditch D1 whose surface is covered with a gate insulating film GF, an upper electrode GD1 of the gate electrode GE is formed and, in each ditch D2 whose surface is covered with an insulating film TF, a lower electrode GD2 of the gate electrode GE is formed.

Each gate electrode GE fills the continuous ditches D1 and D2 without protruding out of the ditch D1. An insulating film IF4 is formed over the epitaxial layer EP and gate electrodes GE. Between every two gate electrodes GE adjacent to each other in the first direction, a ditch D3 is formed. The ditch D3 has a depth extending from the upper surface of the insulating film IF4 into the epitaxial layer. Namely, the insulating film IF4 is divided by plural ditches D3 into plural portions arranged along the first direction. The bottom of each ditch D3 is closer to the upper surface of the epitaxial layer EP than the bottom portion of each ditch D1, i.e. than the boundary between each ditch D1 and the corresponding ditch D2. In FIG. 1, the insulating film TF, gate insulating film GF and insulating film IF4 are hatched alike and no boundaries are shown between them.

The insulating film IF4 covers the upper surface of the epitaxial layer EP between every two ditches D1 and D3 adjacent to each other in the first direction. In each upper surface portion covered, between every two ditches D1 and D3 adjacent to each other in the first direction, by the insulating film IF4 of the epitaxial layer EP, a source region SR which is an n+-type semiconductor region is formed. Each source region SR extends from the side wall of each ditch D3 to the side wall of the adjacent ditch D1. The depth from the upper surface of the epitaxial layer EP of each source region SR is smaller than the depth from the upper surface of the epitaxial layer EP of each ditch D3. Namely, the bottom of each ditch D3 is in a field closer to the semiconductor substrate SB than the source region SR.

Each source region SR is adjacent to the corresponding upper electrode GD1 included in a gate electrode GE via a gate insulating film GF. Each source region SR which is an n$^-$-type semiconductor region, the n$^+$-type semiconductor substrate SB and n$^-$-type epitaxial layer EP respectively include n-type impurities (e.g., phosphorus (P) or arsenic (As)). The concentration of n-type impurities included in each source region SR is higher than the concentration of n-type impurities included in the epitaxial layer EP.

In a vicinity of the bottom of each ditch D3 of the epitaxial layer EP, a base region BR which is a p-type semiconductor region and a p$^+$-type semiconductor region PR are formed. The base region BR and the p$^+$-type semiconductor region PR include p-type impurities (e.g., boron (B)). The concentration of p-type impurities is higher in the p$^+$-type semiconductor region PR than in the base region BR. The base region BR is more extensive than the p$^+$-type semiconductor region PR. The p$^+$-type semiconductor region PR is formed inside the base region BR. In FIG. 1, outlines of p$^+$-type semiconductor regions PR are represented in broken lines.

The upper surface of the base region BR is in contact with the underside of the source region SR. The base region BR extends from the side wall of the ditch D3 to the side walls of the adjacent ditches D1. The base region BR and the p$^+$-type semiconductor region PR are formed to surround a portion of the side wall of the ditch D3 and the bottom of the ditch D3 from outside the ditch D3. The underside of the base region BR is closer to the upper surface of the epitaxial layer EP than the bottom portion of the ditch D1, i.e. the boundary between the ditch D1 and the ditch D2. Namely, the base region BR is formed to be shallower than the ditch D1. The base region BR is adjacent via a gate insulating film GF to the upper electrode GD1 of the gate electrode GE on each side. Namely, the base region BR is in contact with the gate insulating film GF formed over the side wall of the ditch D1 on each side.

A metal-film source electrode SE is formed over the epitaxial layer EP such that the source electrode SE covers the side wall and bottom surface of each ditch D3 and the insulating film IF4. The source electrode SE is electrically coupled with each source region SR and each base region BR. Namely, the source electrode SE fills each ditch D3. Though not shown, a metal-film drain electrode is formed to cover the underside of the semiconductor substrate SB. Namely, the semiconductor substrate SB makes up a drain region. The vertical MOSFET of the present embodiment includes a trench-type gate electrode, a source region SR, a base region BR, and the semiconductor substrate SB making up a drain region. The vertical MOSFET also includes an epitaxial layer EP to serve as a current path.

In the present embodiment, plural ditches D2, lower electrodes GD2 formed in the ditches D2, and insulating films TF are arranged in a second direction which is the depth direction of FIG. 1 extending along the main surface of the semiconductor substrate SB. The second direction is perpendicular to the first direction.

FIG. 2 is a sectional view along the second direction. As shown in FIG. 2, each of the ditches D1 and upper electrodes GD1 shown in FIG. 1 extends along the second direction and, in each of the ditches D1, ditches D2, lower electrodes GD2 and insulating films TF are arranged along the second direction. Namely, under each upper electrode GD1, regions where lower electrodes GD2 are formed and regions where no lower electrodes GD2 are alternately arranged along the second direction.

The bottom surface of each ditch D1 (see FIG. 3) right above the region between two ditches D2 adjacent to each other in the second direction is covered with an insulating film TF as shown in FIGS. 2 and 3. FIG. 3 is a sectional view along the first direction and shows a region between two ditches D2 adjacent to each other in the second direction. The sectional view shown in FIG. 3 is mostly similar to the sectional view shown in FIG. 1, but there is not any ditch D2, lower electrode GD2 or insulating film TF formed below one of the ditches D1 shown in FIG. 3.

As shown in FIG. 3, whereas the side wall of each ditch D1 is covered with a gate insulating film GF, the bottom surface of each ditch D1 is covered with an insulating film TF which is thicker than the gate insulating film GF. Namely, the distance between each gate electrode GE and the epitaxial layer EP via a gate insulating film TF is greater than the distance between each gate electrode GE and the epitaxial layer EP via an insulating film GF.

As seen in FIG. 1, a ditch D2 is formed right below each of two ditches D1 adjacent to each other in the first direction. This indicates that the ditches D2 shown in FIG. 1 are adjacent to each other in the first direction. As seen in FIG. 3, on the other hand, a ditch D2 is formed right below one of two ditches D1 adjacent to each other in the first direction, but no ditch D2 is formed right below the other one of the two ditches D1 adjacent to each other in the first direction.

This is because, as shown in FIG. 4, the ditches D2 are, in a planar view, staggeredly arranged causing an end portion in the second direction of a ditch D2 in a ditch D1 and an end portion in the second direction of a ditch D2 in another ditch D1 to be adjacent to each other as seen in the first direction. Note that, in FIG. 4, the outline of the epitaxial layer EP and the hatching to indicate the outline are omitted.

FIG. 4 is a sectional view extending along the first and second directions and shows lower electrodes GD2 and insulating films TF. As shown in FIG. 4, ditches D2 are arranged along the second direction. Though not shown, a ditch D1 and an upper electrode GD1 both extending along the second direction are formed right above plural ditches D2 spaced apart along the second direction. Namely, the lower electrodes GD2 respectively formed inside plural ditches D2 arranged in the second direction are integrated with a single upper electrode GD1. Thus, unlike the ditches D1 and upper electrodes GD1 extending in the second direction, the ditches D2 and the lower electrodes GD2 are formed like islands.

The ditches D2 formed below ditches D1 adjacent to one another in the first direction are not arrayed like a matrix in a planar view. Namely, relative to a first column of ditches D2 arranged at regular intervals in the second direction, ditches D2 arranged in a second column adjacent to the first column in the first direction are shifted by half an interval in the second direction. In other words, where the first column and the second column are adjacent to each other in the first direction with the first and second columns each including ditches D2 arranged in the second direction, the region between two ditches D2 included in the first column to be adjacent to each other in the second direction is, in the first direction, located beside a ditch D2 of the second column.

The length d of each ditch D2 in the second direction is greater than the distance b between two adjacent ditches D2 in the second direction. Therefore, an end portion in the second direction of a ditch D2 included in the first column is adjacent in the first direction to an end portion in the second direction of a ditch D2 included in the second column within a length range c in the second direction. Namely, two ditches D2 partly adjacent to each other in the first direction overlap each other as seen in the first direction over length c in the second direction. Also, the other end in the second direction of the above ditch D2 included in the first column is adjacent in the first direction to an end portion in the second direction of another ditch D2 included in the second column over the length c in the second direction. Namely, length d less distance b is two times length c.

An end portion in the second direction of a lower electrode GD2 in a ditch D2 included in the first column and an end portion in the second direction of a lower electrode GD2 in a ditch D2 included in the second column are adjacent to each other in the first direction.

It may be conceivable to set distance b to be greater than length d. It is, however, feared that making distance b greater than length d may excessively increase the distance between a lower electrode GD2 in the first column and a lower electrode GD2 in the second column. This may result in preventing the depletion layers to come in contact with each other between the two lower electrodes GD2 even when the vertical MOSFET is turned off. A problem in this case is a decrease in the voltage resistance of the vertical MOSFET.

In the present embodiment, length d is greater than distance b in the second direction, causing a ditch D2 included in the first column and a ditch D2 included in the second column to be adjacent to each other in the first direction. Namely, c≥0. This prevents ditches D2 from being excessively spaced apart and makes it easy for depletion layers extending from plural lower electrodes GD2 to come in contact with one another so as to block the current path in the epitaxial layer EP. In this way, the voltage resistance of the vertical MOSFET can be maintained, so that the reliability of the semiconductor device can be secured.

Assume a case where distance a in the first direction between a ditch D2 in the first column and a ditch D2 in the second column is such that the depletion layers extending from the corresponding lower electrodes GD2 partly adjacent to each other in the first direction come in contact with each other. If, in such a case, distance b is made greater than distance a, the depletion layers extending from two lower electrodes GD2 partly adjacent to each other in the second direction may be prevented from coming into contact with each other. This decreases the voltage resistance of the vertical MOSFET in an off state. In the present embodiment, to prevent such a voltage resistance decrease and facilitate contacting between depletion layers, distance a is greater than distance b. This secures the voltage resistance of the vertical MOSFET and thereby improves the reliability of the semiconductor device.

Relative to the length of a ditch D1 extending in the second direction (see FIG. 1), the sum of the lengths d of the ditches D2 formed in the bottom portion of the ditch D1 is, for example, greater than 50% without exceeding 80%. Namely, relative to the length of a ditch D1 extending in the second direction, the presence ratio of a column of ditches D2 formed in the ditch D1 is greater than 50% without exceeding 80%. Hence, the ratio of distance b to length d is 20% or higher without reaching 50%.

Assume an alternative arrangement in which, instead of arranging plural ditches D2 and lower electrodes GD2 along a longer ditch D1 extending in the second direction as described above, a ditch D2 and a lower electrode GD2 each being as long as a ditch D1 in the second direction are formed along a ditch D1. A problem caused in such an arrangement will be described in the following with reference to FIG. 16 which shows a sectional view of an example of such an alternatively arranged semiconductor device for comparison. The sectional view shown in FIG. 16 is one taken along the main surface of a semiconductor substrate (not shown) and includes a sectional view of lower electrodes GD2, i.e. a sectional view of a semiconductor device portion corresponding to that shown in FIG. 4.

Figure 16:
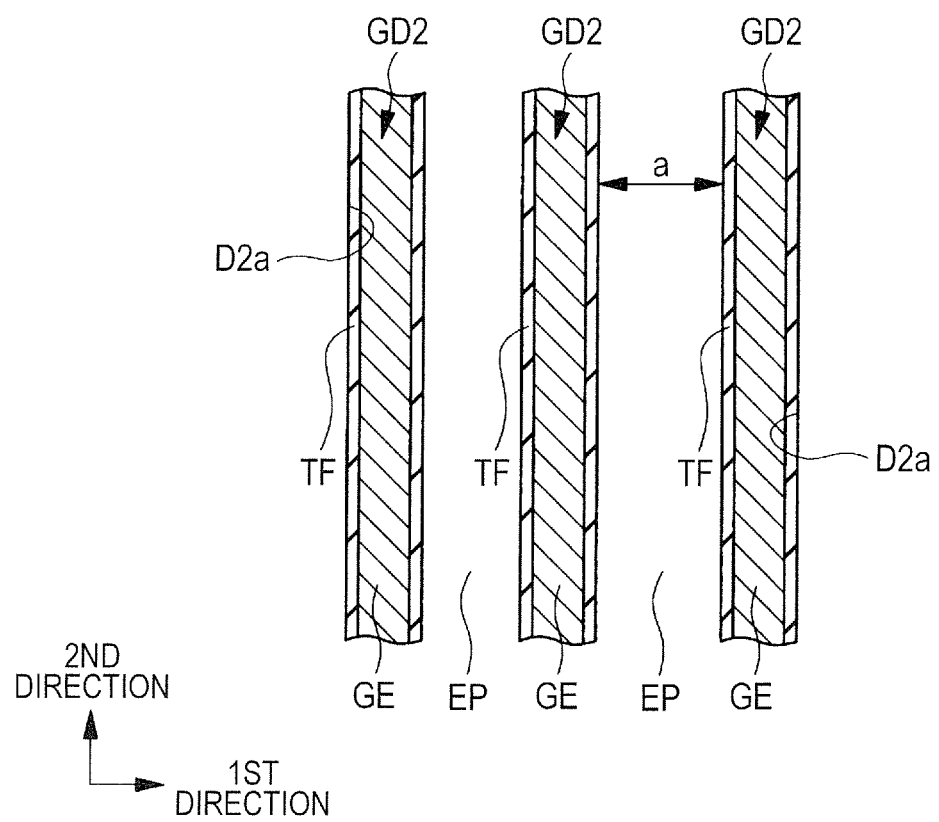
FIG. 16 is a sectional view of an example semiconductor device for comparison in a manufacturing process.

As shown in FIG. 16, in the example semiconductor device for comparison (hereinafter also referred to as "the example for comparison"), each ditch D2a and the lower electrode GD2 in each ditch D2a extend in the second direction along the ditch D1 (not shown) extending above each ditch D2a. The ditches D2a and the lower electrodes GD2 in the ditches D2a are arranged in the first direction. The ditches D2a and the lower electrodes GD2 in the ditches D2a are formed like stripes without being divided into plural discrete portions in the second direction. A sectional view taken along a direction perpendicular to the substrate main surface of the example semiconductor device for comparison is similar to the sectional view shown in FIG. 1.

In the above arrangement, the depletion layers extending from the respective lower electrodes GD2 can be mutually in contact when the vertical MOSFET is in an off state, so that, compared with cases in which the ditches D2a are not formed, a high voltage resistance can be secured. However, forming lower electrodes GD2 in ditches D2a by extending lower portions of gate electrodes toward the semiconductor substrate (toward the drain region side) increases the capacitance (feedback capacitance Crss) between the lower electrodes GD2 and the drain region. In this case, the speed of rising/falling to an on/off state of the vertical MOSFET in switching operation decreases, so that the switching speed of the vertical MOSFET decreases. As a result, the reliability of the semiconductor device reduces.

When the vertical MOSFET is in an on state, the gate potential applied to a lower electrode GD2 in a ditch D2a attracts minority carriers in the epitaxial layer EP to a vicinity of the ditch D2a. However, with a thick insulating film TF formed in the ditch D2a, an effect of generating a low-resistance layer in the epitaxial layer EP (an accumulation effect) is scarcely obtained. Namely, increasing the presence ratio of ditches D2 scarcely causes a resistance decrease by an accumulation effect. Such a small advantageous effect of a resistance decrease by an accumulation effect is cancelled by a disadvantageous effect of a resistance increase caused when, with the ditches D2a occupying a large portion of the epitaxial layer EP, the cross-sectional area of the source-drain current path is reduced.

The above problem will become more conspicuous as the distance between ditches D2a adjacent to each other in the first direction is more reduced as semiconductor devices are more miniaturized in the future. In this regard, reducing the presence ratio of the ditches D2a relatively increasing the presence ratio of the epitaxial layer EP makes it possible to secure a current path with a larger cross-sectional area in the epitaxial layer EP. This facilitates reducing the on resistance.

Therefore, in the present embodiment, as shown in FIG. 1, a vertical MOSFET includes a gate electrode GE buried in each ditch D1 extending in the second direction. In a bottom portion of each ditch D1, plural ditches D2 are formed being arranged in the second direction. Each ditch D2 includes a lower electrode GD2 which is a part of a gate electrode GE. In each ditch D2, an insulating film TF thicker than the gate insulating film GF covering the side wall of each ditch D1 is formed.

As described above, instead of forming a ditch D2 extending in the second direction, ditches D2 are arranged like discrete islands in the second direction. In this way, the area of the lower electrodes GD2 to be opposed to the semiconductor substrate SB making up a drain region can be reduced. Therefore, in the present embodiment compared with the example for comparison, the capacitance (feedback capacitance Crss) generated between the gate electrodes GE and the drain region is prevented from increasing. Hence, the switching speed of the vertical MOSFET is prevented from decreasing.

Also, in the present embodiment compared with the example for comparison, the presence ratios of the ditches D2 and the lower electrodes GD2 are small. Namely, in the present embodiment compared with the example for comparison, the portions of the epitaxial layer EP occupied by the ditches D2 are small. In the present embodiment, however, when the vertical MOSFET is switched into an off state, the depletion layers extending from the lower electrodes GD2 arranged like discrete islands mutually contact. Therefore, the voltage resistance of the vertical MOSFET of the present embodiment does not become smaller than that of the example for comparison. Namely, by forming the ditches D2, a high voltage resistance can be secured between the drain region and the source region. Hence, majority carrier depletion is not hampered. Therefore, even with a relatively high impurity concentration in the epitaxial layer EP aimed at an on-resistance reduction, depletion layers can be easily extended. This makes it possible to secure a high drain-source resistance.

Also, reducing the presence ratio of the ditches D2 to be lower than in the example for comparison increases the sectional area with respect to the flow direction of the epitaxial layer to be a source-drain current path. This reduces the on resistance of the MOSFET.

As shown in FIG. 3, the bottom surface of a ditch D1 with no ditch D2 formed immediately therebelow is covered with an insulating film TF thicker than the gate insulating film GF. This prevents the capacitance generated between the gate electrode GE (upper electrode GD1) formed in the ditch D1 and the epitaxial layer EP forming the bottom of the ditch D1 immediately under the gate electrode GE from increasing. Hence, the switching speed of the vertical MOSFET is prevented from decreasing.

Thus, according to the semiconductor device of the present embodiment, the on resistance of the vertical MOSFET can be reduced while preventing voltage resistance reduction and switching speed reduction caused by an increase of feedback capacitance Crss. This improves performance of the semiconductor device.

As for the lower electrodes GD2, they are all integrated with the corresponding upper electrodes GD1, so that there is not any problem as to securing their potentials.

<Semiconductor Device Manufacturing Method>

A semiconductor device manufacturing method according to the present embodiment will be described with reference to FIGS. 5 to 13. FIGS. 5 to 13 are sectional views of a semiconductor device in manufacturing processes according to the present embodiment. The semiconductor device being manufactured in the present case is an n-channel type vertical MOSFET.

Figure 5:
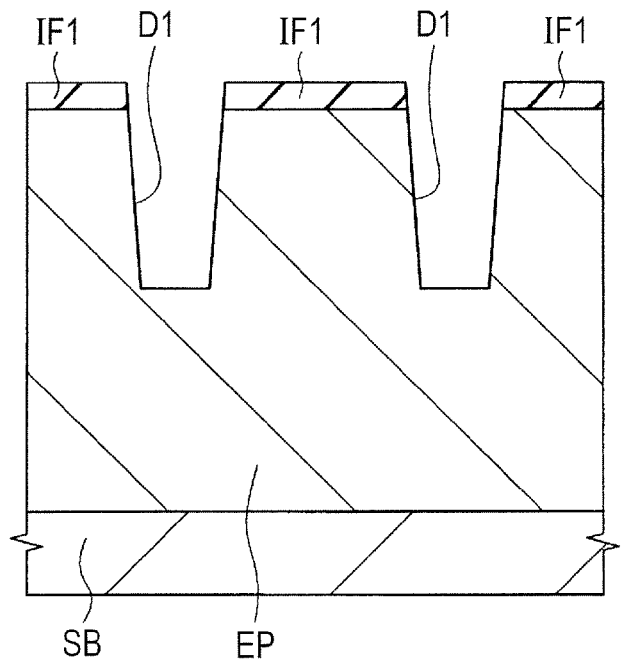
FIG. 5 is a sectional view of a semiconductor device in a manufacturing process according to the first embodiment.

First, as shown in FIG. 5, an $n^+$-type semiconductor substrate SB of monocrystal silicon is prepared. Next, an epitaxial layer EP is formed over the semiconductor substrate SB by an epitaxial growth method. The epitaxial layer EP is, for example, an $n^-$-type semiconductor layer. An insulating film IF1 is formed over the epitaxial layer EP, for example, by a chemical vapor deposition (CVD) method.

Next, using a photolithography technique, the insulating film IF1 is patterned by etching. At this time, a resist is used for masking. The insulating film IF1 may be, for example, a hard mask of silicon oxide film. Subsequently, plural ditches D1 each extending in the second direction are formed in an upper surface portion of the epitaxial layer EP, for example, by dry-etching the epitaxial layer EP using the insulating film IF1 for masking. The ditches D1 are formed to be arranged in the first direction.

Figure 6:
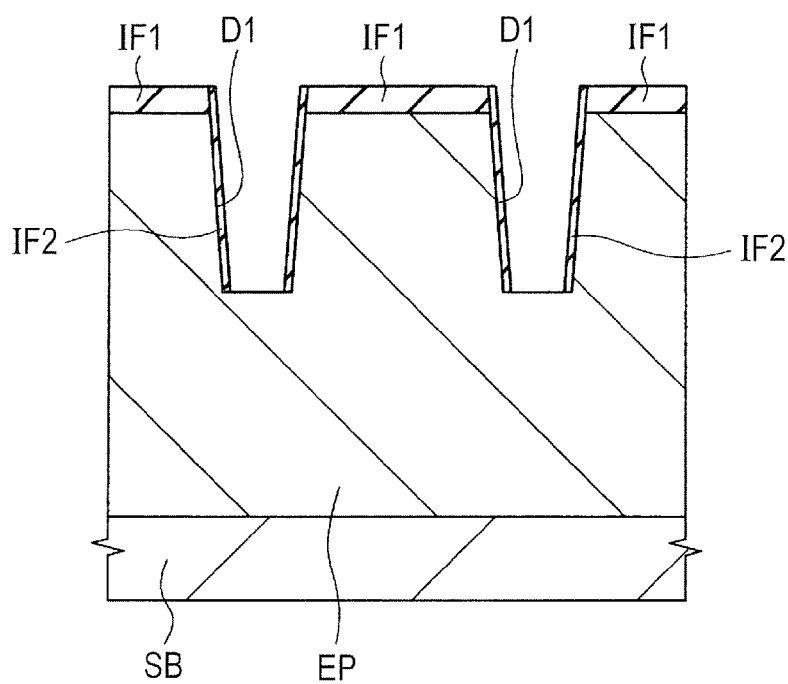
FIG. 6 is a sectional view of the semiconductor device in a manufacturing process following the process shown in FIG. 5.

Next, as shown in FIG. 6, an insulating film IF2 of, for example, silicon nitride is formed inside each ditch D1, for example, by a CVD method. Namely, the side wall and bottom surface of each ditch D1 are covered with the insulating film IF2. The insulating film IF2 being thin does not completely fill the ditch D1. Subsequently, the insulating film IF2 covering the bottom surface of the ditch D1 is partly removed, for example, by dry etching (anisotropic etching) using a photolithography technique.

At this time, the insulating film IF2 covering the bottom surface portion corresponding to each ditch D2 shown in FIG. 1 is removed, whereas the insulating film IF2 covering the other bottom surface portion of each ditch D1 is left unremoved. The insulating film IF2 covering the side wall of each ditch D1 is not removed, either. As a result of this, the bottom surface of each ditch D1 extending in the second direction is exposed from the insulating film IF2 at plural portions along the second direction.

Figure 7:
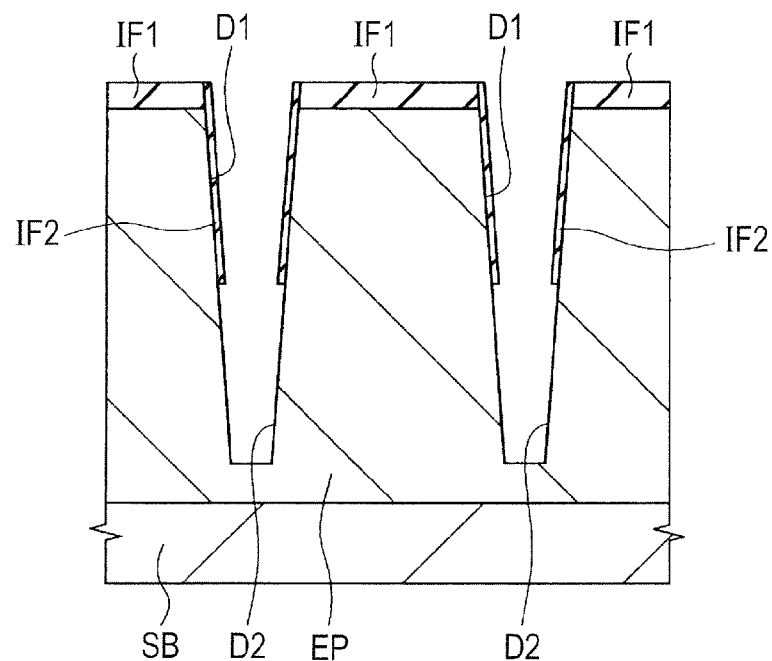
FIG. 7 is a sectional view of the semiconductor device in a manufacturing process following the process shown in FIG. 6.

Next, as shown in FIG. 7, by dry-etching the bottom surface of each ditch D1 using the insulating film IF2 for masking, ditches D2 are formed in the bottom surface portions exposed from the insulating film IF2 of each ditch D1. At this time, the other bottom surface portions and side wall of each ditch D1 covered with the insulating film IF2 are left unetched. In this way, ditches D2 arranged in the second direction are formed in the bottom portion of each ditch D1 extending in the section direction. Each of the ditches D2 thus formed has a depth extending into the epitaxial layer EP without reaching the semiconductor substrate SB.

Figure 8:
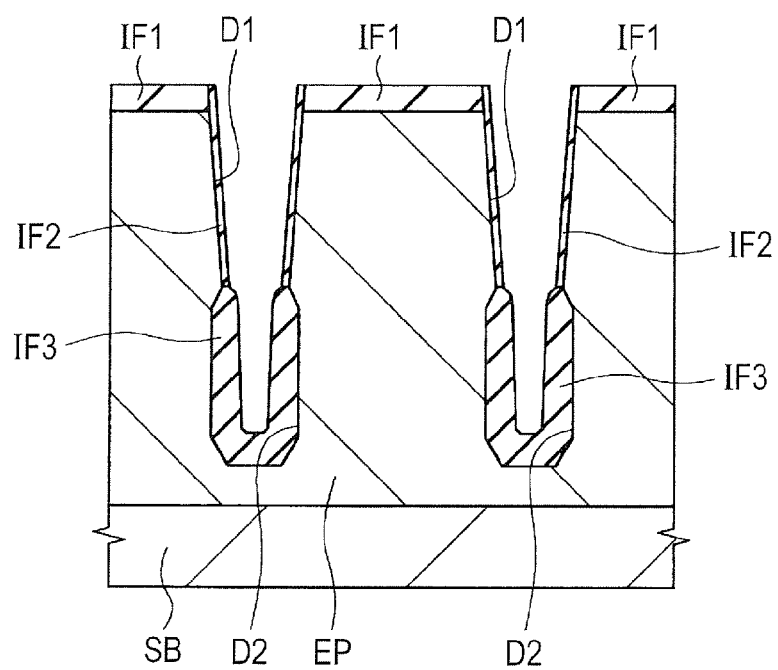
FIG. 8 is a sectional view of the semiconductor device in a manufacturing process following the process shown in FIG. 7.

Next, as shown in FIG. 8, by oxidizing the epitaxial layer portion forming each ditch D2 including the side wall and bottom surface of each ditch D2, a sacrificial oxide film IF3 is formed covering the side wall and bottom surface of each ditch D2. In this oxidation process, the sacrificial oxide film IF3 is formed to expand in the width direction (the first direction) of each ditch D2. Namely, the epitaxial layer EP portion forming the side wall and bottom surface of each ditch D2 is oxidized to form an oxide film with some thickness. This expands the side wall width in the first direction of each ditch D2. In this process, the epitaxial layer EP portion forming each ditch D1 is not oxidized with the side wall of each ditch D1 covered with an insulating film IF2.

Figure 9:
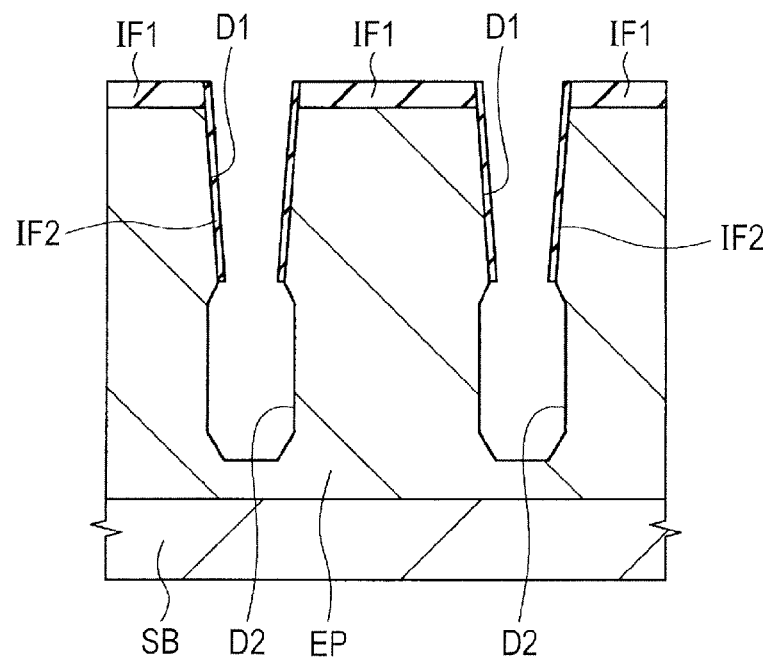
FIG. 9 is a sectional view of the semiconductor device in a manufacturing process following the process shown in FIG. 8.

Next, as shown in FIG. 9, the sacrificial oxide film IF3 formed in each ditch D2 is removed by wet etching. As the sacrificial oxide film IF3 is formed and removed as described above, each ditch D2 is expanded. The magnitude of expansion of each ditch D2 can be optionally adjusted by changing the thickness of the sacrificial oxide film IF3 formed in the process described with reference to FIG. 8.

Figure 10:
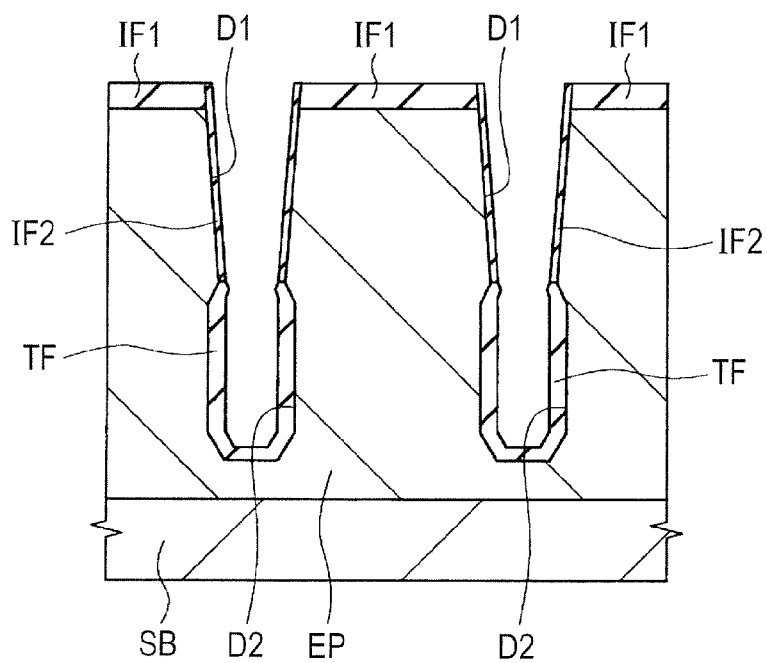
FIG. 10 is a sectional view of the semiconductor device in a manufacturing process following the process shown in FIG. 9.

Next, as shown in FIG. 10, by oxidizing the side wall and bottom surface of each ditch D2 expanded as described above, an insulating film (field oxide film) TF is formed. At this time, though the bottom surface of each ditch D1 with no ditch D2 formed immediately therebelow is covered with an insulating film IF2, an insulating film TF is formed over a bottom surface portion in a region close to a ditch D2 of such a ditch D1. Alternatively, to cover the whole bottom surface of each ditch D1 with an insulating film TF, only the insulating film IF2 covering the bottom surface of each ditch D1 may be selectively removed between the process described with reference to FIG. 7 and the process described with reference to FIG. 10.

Figure 11:
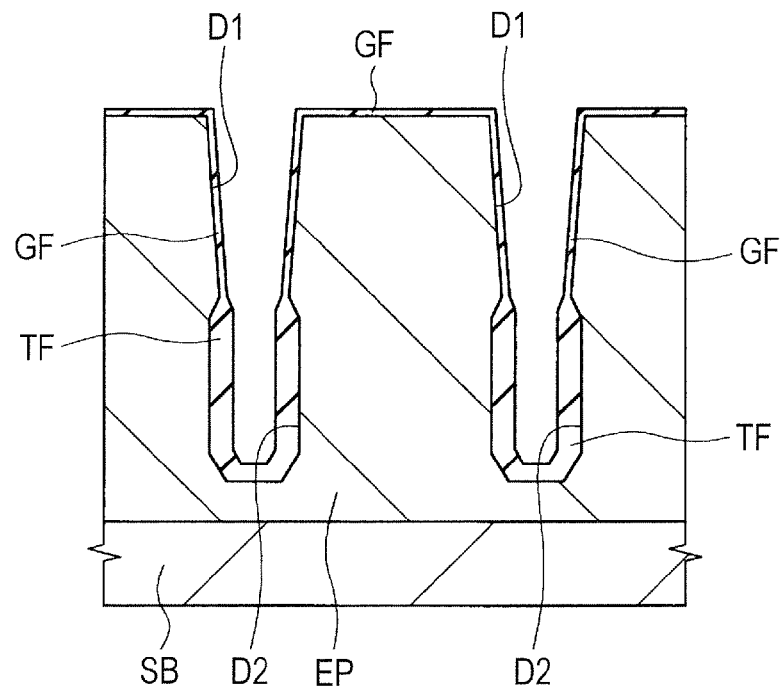
FIG. 11 is a sectional view of the semiconductor device in a manufacturing process following the process shown in FIG. 10.

Next, as shown in FIG. 11, the insulating film IF2 formed in each ditch D1 is removed by etching. Subsequently, a gate insulating film GF is formed over the side wall of each ditch D1 by performing an oxidization process. In the oxidation process performed to form a gate insulating film, the insulating film TF formed as described with reference to FIG. 10 becomes thicker as a result of further oxidation. Thus, the insulating film TF is thicker than the gate insulating film GF. In the process, an insulating film TF is also formed over the bottom surface portions with no ditch D2 formed immediately therebelow of each ditch D1 (see FIG. 3).

Figure 12:
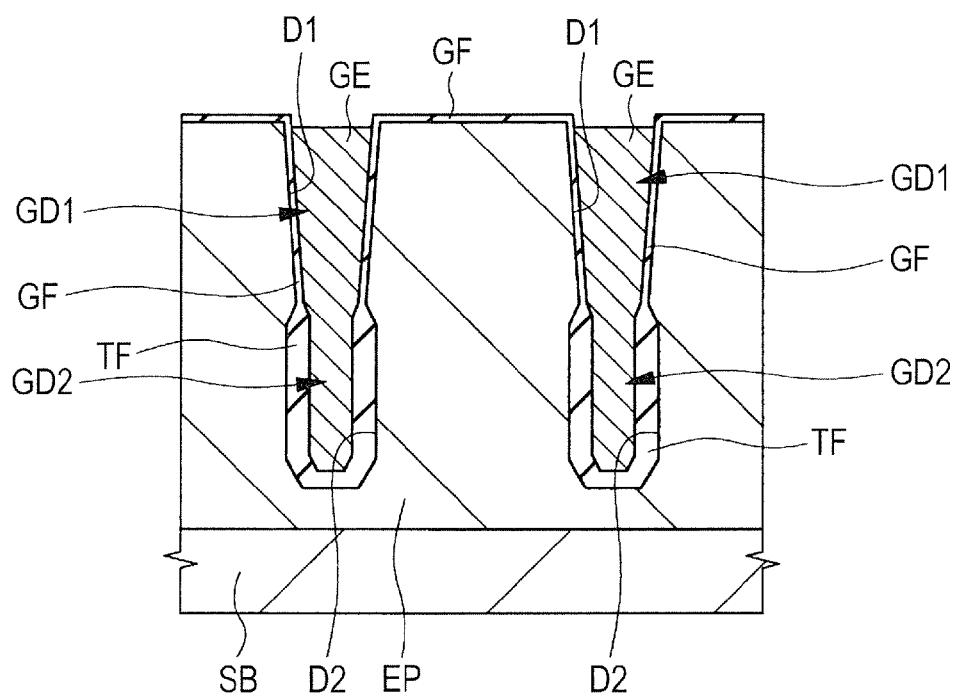
FIG. 12 is a sectional view of the semiconductor device in a manufacturing process following the process shown in FIG. 11.

Next, as shown in FIG. 12, gate electrodes GE are formed by filling ditches D1 and D2 with electrode forming film. The electrode forming film may be, for example, polysilicon. Polysilicon film can be formed, for example, by a CVD method. In the present embodiment, after the polysilicon is formed, unrequired portions of the polysilicon film over the epitaxial layer EP are removed, thereby forming gate electrodes GE. In this specification, the electrode portion formed in each ditch D1 covered with a gate insulating film GF is referred to as an "upper electrode GD1" and the electrode portion formed in each ditch D2 covered with an insulating film TF is referred to as a "lower electrode GD2."

Figure 13:
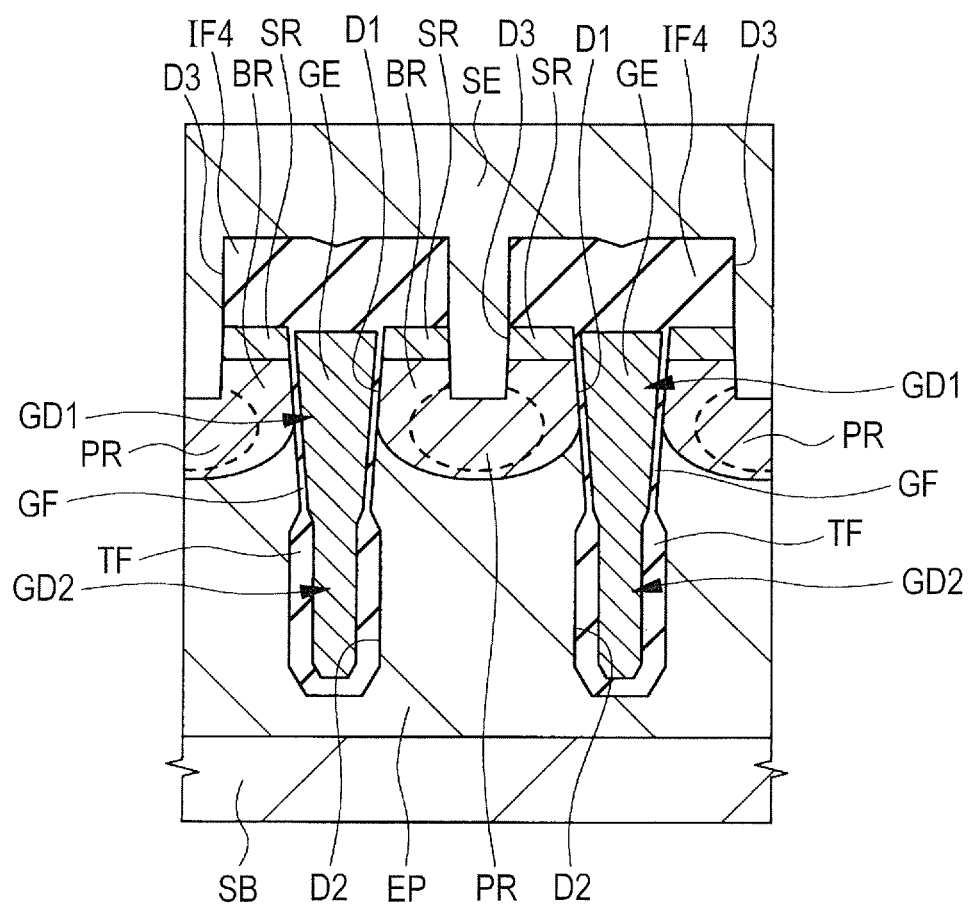
FIG. 13 is a sectional view of the semiconductor device in a manufacturing process following the process shown in FIG. 12.

Next, as shown in FIG. 13, by injecting impurities into the regions between gate electrodes GE, for example, by an ion implantation method, base regions BR which are p-type semiconductor regions, $p^+$-type semiconductor regions PR and source regions SR which are $n^+$-type semiconductor regions are formed. Also, over the gate electrodes GE and source regions SR, insulating films IF4 which are interlayer insulating films are formed, for example, by a CVD method. Furthermore, ditches D3 are formed in upper surface portions of the epitaxial layer EP by performing etching using a photolithography technique. The ditches D3 each have a depth extending from the upper surface of the insulating film IF4 into the epitaxial layer EP. Subsequently, a source electrode SE is formed, for example, by a sputtering method to fill each ditch D3.

The base regions BR and $p^+$-type semiconductor regions PR can be formed, for example, by injecting p-type impurities (e.g. boron (B)) into the epitaxial layer EP. The source regions SR can be formed by injecting n-type impurities (e.g., phosphorus (P) or arsenic (As)) into the epitaxial layer EP. The $p^+$-type semiconductor regions PR are formed, for example, by injecting ions after ditches D3 are formed. Subsequently, a drain electrode (not shown) is formed to be in contact with the reverse side of the semiconductor substrate SB.

A vertical MOSFET including gate electrodes GE, source regions SR, and semiconductor substrate SB serving as a drain region is formed through the processes described above. According to the present embodiment, an insulating film TF thicker than the gate insulating film GF is formed in each ditch D2, and the ditches D1 and D2 have opening widths large enough to receive electrode material. In the present embodiment, ditches D2 are formed to be arranged in the second direction immediately below each ditch D1. The ditches D2 and lower electrodes GD2 are, as shown in FIG. 4, staggeredly arranged. That is, the ditches D2 in the first column and the ditches D2 in the second column are mutually shifted in the second direction.

According to the semiconductor device manufacturing process of the present embodiment, ditches D2 and lower electrodes GD2 immediately below the respective ditches D2 are formed such that they are arranged at regular intervals in the second direction. The semiconductor devices manufactured in this way can generate the same effects as those described with reference to FIGS. 1 to 4.

Hence, according to the semiconductor device of the present embodiment, the on resistance of the vertical MOSFET can be reduced while preventing voltage resistance reduction and switching speed reduction caused by an increase of feedback capacitance Crss. This improves performance of the semiconductor device.

Second Embodiment

Figure 14:
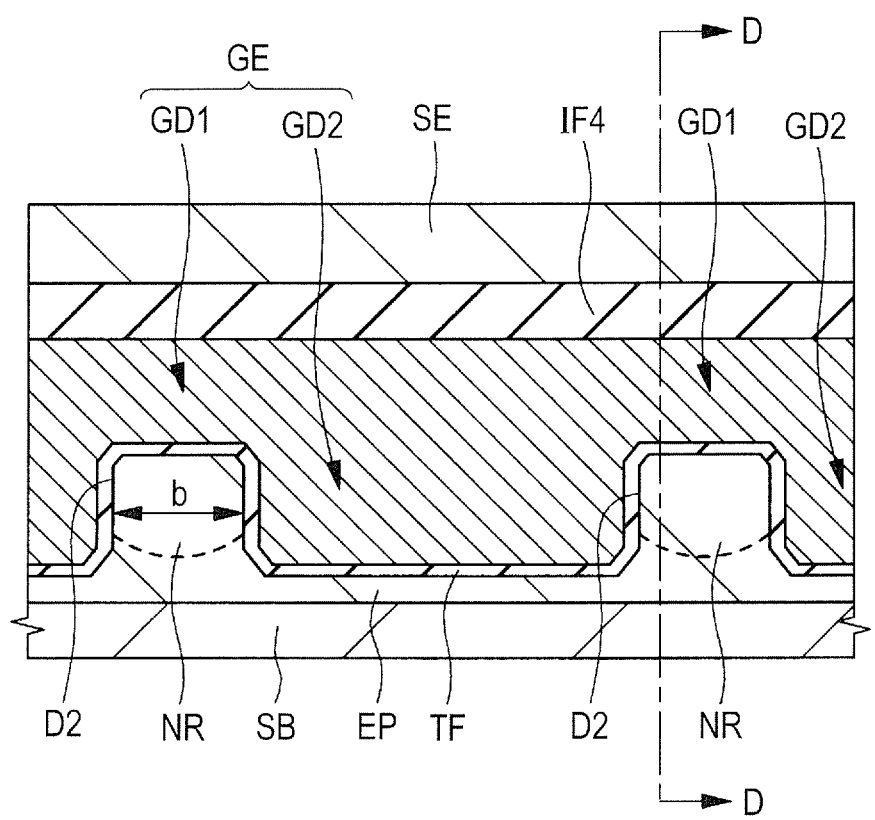
FIG. 14 is a sectional view of a semiconductor device according to a second embodiment of the present invention.
Figure 15:
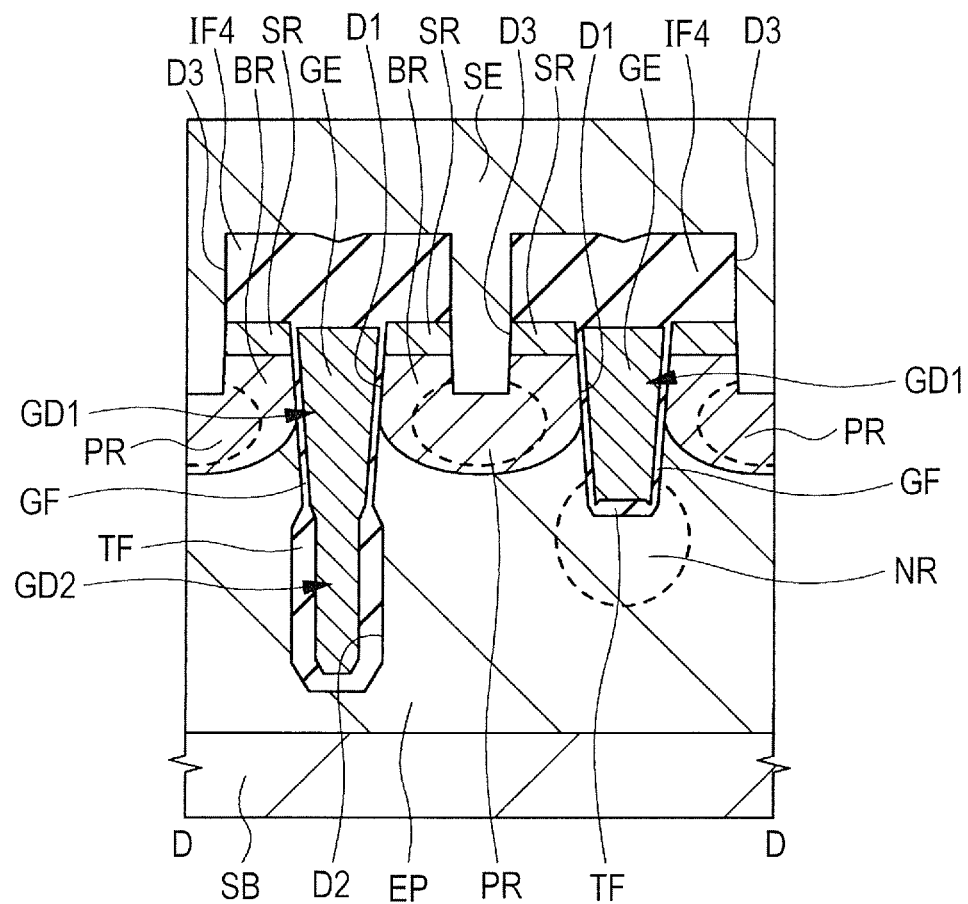
FIG. 15 is a sectional view taken along line D-D in FIG. 14.

A semiconductor device of a second embodiment will be described with reference to FIGS. 14 and 15. FIGS. 14 and 15 are sectional views of the semiconductor device of the present embodiment. FIG. 14 is a sectional view corresponding to the sectional view shown in FIG. 2. FIG. 15 is a sectional view corresponding to the sectional view shown in FIG. 3. Namely, FIG. 15 shows a sectional view taken along line D-D in FIG. 14.

As shown in FIGS. 14 and 15, n-type semiconductor layers NR are formed in upper surface portions between ditches D2 formed adjacently in the second direction of the epitaxial layer EP. Namely, the n-type semiconductor layers NR are formed in portions of the epitaxial layer EP which are in vicinities of bottom surface portions of each ditch D1. In FIGS. 14 and 15, each n-type semiconductor layer NR is shown in broken line.

The n-type semiconductor layers NR can be formed by injecting n-type impurities (e.g., phosphorus (P) or arsenic (As)) into portions, near bottom surfaces of ditches D1, of the epitaxial layer EP using an ion implantation method. This may be done, for example, between the process for forming an insulating film IF2 described with reference to FIG. 6 and the process for forming ditches D2 described with reference to FIG. 7. In other respects, the manufacturing process of the present embodiment is similar to the manufacturing process of the first embodiment.

In the present embodiment, n-type semiconductor layers NR which are impurity layers higher in impurity concentration than the epitaxial layer EP that is an $n^-$-type semiconductor layer are formed in portions, near bottoms of ditches D1, of the epitaxial layer EP. In this way, the voltage resistance of the portions where n-type semiconductor layers NR are formed of the epitaxial layer EP can be reduced. Hence, the on resistance of the vertical MOSFET can be reduced and the performance of the semiconductor device can be improved.

In the present embodiment, the impurity concentration near the bottom of each ditch D1 is higher than in the first embodiment. It is, therefore, necessary to adjust distance b, i.e. the distance between ditches D2 adjacent to each other in the second direction according to the impurity concentration. To be concrete, it is necessary to shorten the distance b to prevent the source-drain voltage resistance from decreasing.

The invention made by the present inventors have been concretely described based on embodiments. However, the present invention is not limited to the above embodiments and can be modified in various ways without departing from the scope of the invention.

For example, even though the first and second embodiments have been described based on an n-channel type vertical MOSFET, the same advantageous effects as those of the first and second embodiments can also be obtained based on a p-channel type vertical MOSFET. A p-type vertical MOSFET can be formed by reversing the conductivity types of the semiconductor regions included in the MOSFET described in connection with the first and second embodiments.

What is claimed is:
1. A semiconductor device, comprising:
a semiconductor layer formed over a semiconductor substrate;
a plurality of first ditches arranged in a first direction extending along an upper surface of the semiconductor substrate, the first ditches each extending in a second direction perpendicular to the first direction;
a plurality of second ditches arranged, in a bottom surface portion of each of the first ditches, in the second direction;
gate electrodes formed inside the first ditches and the second ditches;
a first insulating film formed between the gate electrodes and the first ditches;
a second insulating film formed between the gate electrodes and the second ditches;
a source region formed in an upper surface portion of the semiconductor layer, and
a drain region formed in the semiconductor substrate,
wherein, in the first ditches adjacently arranged in the first direction, distances between an upper surface of the gate electrodes and a bottom surface of the second insulating film are different.
2. The semiconductor device according to claim 1, wherein the second ditches formed in the bottom surface portions of the first ditches, adjacently formed in the first direction, are staggered between the first ditches.

3. The semiconductor device according to claim 1, wherein the second ditches formed in the bottom surface portions of the first ditches, adjacently formed in the first direction, are arranged at regular intervals in the second direction, and wherein the second ditches formed in the bottom surface portions of a first one of the first ditches, adjacently formed in the first direction, are shifted by half an interval relative to the second ditches formed in the bottom surface portions of a second one of the first ditches adjacently formed in the first direction.

4. The semiconductor device according to claim 1, wherein a distance between two of the second ditches adjacent to each other in the first direction is greater than a distance between two of the second ditches adjacent to each other in the second direction.

5. The semiconductor device according to claim 2, wherein a length of each of the second ditches arranged in the second direction is greater than a distance between two of the second ditches adjacent to each other in the second direction.

6. The semiconductor device according to claim 2, wherein an end portion of each of the second ditches formed in the bottom surface portions of a first one of the first ditches adjacently arranged in the first direction overlaps, as seen in the first direction, an end portion of one of the second ditches formed in the bottom surface portions of a second one of the first ditches adjacently arranged in the first direction.

7. The semiconductor device according to claim 1, wherein the second insulating film is thicker than the first insulating film.

8. The semiconductor device according to claim 1, wherein each bottom surface portion between the second ditches arranged in the second direction of each of the first ditches is covered with a third insulating film thicker than the first insulating film.

9. The semiconductor device according to claim 1, wherein the semiconductor layer, the source region, and the drain region include a first conductivity type, wherein a first semiconductor region of a second conductivity type, different from the first conductivity type, is formed over a side wall of each of the first ditches, and wherein a second semiconductor region of the first conductivity type is formed over each bottom surface portion between the second ditches arranged in the second direction of each of the first ditches, the second semiconductor region being higher in impurity concentration than the semiconductor layer.

10. The semiconductor device according to claim 1, wherein the gate electrodes, the source region, and the drain region configure a field effect transistor.

11. The semiconductor device according to claim 1, wherein the second insulating film is disposed on the bottom surface portion of one of the first ditches that are adjacently arranged in the first direction.

12. The semiconductor device according to claim 11, wherein one of the second ditches extends from the bottom surface portion of another one of the first ditches that are adjacently arranged in the first direction.

13. The semiconductor device according to claim 1, wherein a first semiconductor region having a conductivity type, different from a conductivity type of the semiconductor layer, is formed over a side wall of each of the first ditches.

14. The semiconductor device according to claim 13, wherein a second semiconductor region is formed over each bottom surface portion between the second ditches arranged in the second direction of each of the first ditches, the second semiconductor region being higher in impurity concentration than the semiconductor layer.

15. A semiconductor device, comprising:
a semiconductor layer formed over a semiconductor substrate;
a plurality of first ditches arranged in a first direction extending along an upper surface of the semiconductor substrate, the first ditches each extending in a second direction perpendicular to the first direction;
a plurality of second ditches arranged, in a bottom surface portion of each of the first ditches, in the second direction;
gate electrodes formed inside the first ditches and the second ditches;
a first insulating film formed between the gate electrodes and the first ditches;
a second insulating film formed between the gate electrodes and the second ditches;
a source region formed in an upper surface portion of the semiconductor layer, and
a drain region formed in the semiconductor substrate,
wherein the second ditches formed in the bottom surface portions of the first ditches, adjacently formed in the first direction, are staggered between the first ditches.

* * * * *